United States Patent [19]
Kwon

[11] Patent Number: 5,973,962
[45] Date of Patent: Oct. 26, 1999

[54] METHOD OF PROGRAMMING NON-VOLATILE MEMORY DEVICES HAVING A NAND TYPE CELL ARRAY

[75] Inventor: Suk-chun Kwon, Kyunggi-do, Rep. of Korea

[73] Assignee: Samsung Electronics Co., Ltd., Rep. of Korea

[21] Appl. No.: 09/218,775

[22] Filed: Dec. 22, 1998

[30] Foreign Application Priority Data

Dec. 29, 1997 [KR] Rep. of Korea ...................... 97-77279

[51] Int. Cl.⁶ .................................................. G11C 16/04
[52] U.S. Cl. .............................. 365/185.18; 365/185.17; 365/185.28
[58] Field of Search ........................ 365/185.18, 185.17, 365/185.28

[56] References Cited

U.S. PATENT DOCUMENTS

| | | | |
|---|---|---|---|
| 5,345,418 | 9/1994 | Challa | 365/185 |
| 5,568,420 | 10/1996 | Lim et al. | 365/185.17 |
| 5,677,873 | 10/1997 | Choi et al. | 365/185.17 |
| 5,696,717 | 12/1997 | Koh | 365/185.22 |
| 5,734,609 | 3/1998 | Choi et al. | 365/185.17 |
| 5,815,438 | 9/1998 | Haddad et al. | 365/185.17 |

*Primary Examiner*—David Nelms
*Assistant Examiner*—Tuan T. Nguyen
*Attorney, Agent, or Firm*—Myers Bigel Sibley & Sajovec

[57] ABSTRACT

A method for programming non-volatile semiconductor memory devices having NAND cell arrays is provided. In a program operation, a pass voltage is applied to unselected word lines, and then a voltage lower than the pass voltage is applied to only the word line which is adjacent to a selected word line and is placed between the selected word line and a reference selection circuit. According to this programming method, the memory device can be programmed without restriction of programming sequence.

2 Claims, 3 Drawing Sheets

METHOD OF PROGRAMMING NON-VOLATILE MEMORY DEVICES HAVING A NAND TYPE CELL ARRAY

FIELD OF THE INVENTION

The present invention relates to the field of non-volatile semiconductor memory devices and, more particularly, to method for programming non-volatile EEPROM (Electrically Erasable and Programmable Read-Only Memory) devices having a NAND type cell array.

BACKGROUND OF THE INVENTION

To increase memory capacity, EEPROMs having NAND structured memory cells (hereinafter, referred to as "NAND cell strings") have been developed. Referring to FIG. 1, there are shown two NAND cell strings 102 and 104 connected to bit lines BL1 and BL2, respectively. As shown, a NAND cell string 102 or 104 includes two select transistors Mss and Mgs, and memory cell transistors M1 to Mi whose drain-source paths are connected in series between a source of string select transistor Mss and a drain of ground (or source) select transistor Mgs.

Each of the memory cell transistors M1 through Mi has its drain and source spaced apart by its channel. Further, its floating gate is formed on a tunnel oxide film over the channel and its control gate is formed on an intermediate dielectric film over the floating gate. A drain of the string select transistor Mss is connected to the bit line BL1 or BL2 and a source of the ground select transistor Mgs is connected to a common source line (not shown) which is grounded during either programming or read operation. Gates of string select transistor Mss and ground select transistor Mgs are coupled with a string selection line SSL and a ground selection line GSL, respectively. Gates of memory cell transistors M1 through Mi are connected to word lines WL1 through WLi, respectively.

With the NAND structure described above, since the number of contact holes connected to the bit line per memory cell transistor is reduced, EEPROMs having a high density memory capacity can be accomplished.

A conventional program operation of NAND structured EEPROMs will be described below.

Before programming the memory transistors of a NAND structured EEPROM, an erase operation is normally performed. In this operation, the erasure of memory cell transistors M1 through Mi will be accomplished by applying an erase potential, such as 20 volts, to a semiconductor substrate and applying a reference potential, such as 0 volts (i.e., ground voltage $V_{SS}$), to word lines WL1 to WLi. Electrons stored by the floating gates of memory cell transistors M1 to Mi will be extracted by Fowler-Nordheim tunneling (F-N tunneling), and thereby the memory cell transistors M1 to Mi will be changed into depletion mode transistors. It is commonly assumed that erased memory cell transistors store logic "0" data.

After such an erase operation, a program or write operation is performed as illustrated in FIG. 2 which is a timing diagram of a conventional program operation. For example, assume that memory cell transistor M5 is to be programmed. In this operation, with reference to FIG. 2, first, a power supply voltage $V_{CC}$ and a ground voltage $V_{SS}$ is applied to the string selection line SSL and ground selection line GSL, respectively. Further, each of the bit lines BL1 and BL2 is supplied with either the ground voltage $V_{SS}$ (data "0") or the power supply voltage $V_{CC}$ (data "1") in accordance with the data state to be programmed. It is assumed herein that the bit lines BL1 and BL2 are supplied with power supply voltage $V_{CC}$ (data "1") and the ground voltage $V_{SS}$ (data "0"), respectively. Subsequently, a pass voltage $V_{pass}$, such as 8 volts, is applied to the word lines WL1–WL4 and WL6–WLi, i.e., unselected word lines except a selected word line WL5, and the semiconductor substrate is supplied with a reference potential, such as ground voltage $V_{SS}$. After an elapse of a given time, the word lines WL4 and WL6, adjacent to the selected word line WL5, are applied with a voltage lower than the pass voltage $V_{pass}$, for example, ground voltage $V_{SS}$. Thereafter, a program voltage $V_{pgm}$, such as 18 volts, is applied to the selected word line WL5.

In such a program operation, the string select transistor Mss in the string 102 coupled with bit line BL1 of the power supply voltage $V_{CC}$ will be turned off so that the cell string 102 will be floated. Thus, the source, drain and channel potentials of the selected cell transistor M5 in the string 102 will be boosted up due to the capacitive coupling when the program voltage $V_{pgm}$ is applied to the control gate of the transistor M5 in the string 102. Namely, the difference between the control gate potential and the source-drain-chanel potential will not be large enough to permit F-N tunneling to occur. So, the selected cell transistor M5 in the string 102 will remain erased.

On the contrary, the source, drain and channel potentials of the selected cell transistor M5 in the string 104 will equal the ground voltage $V_{SS}$ since the string select transistor Mss in the string 104 coupled to bit line BL2 of the ground voltage $V_{SS}$ will be turned on, thereby electrons will be trapped and accumulate to the floating gate of the transistor M5 in the string 104 by F-N tunneling when the program voltage $V_{pgm}$ is applied to the control gate of the transistor M5 in the string 104. The accumulation of a large quantity of trapped electrons on the floating gate causes the effective threshold voltage of the cell transistor M5 in the string 104 to increase (e.g., about 6–7 V). Consequently, the selected cell transistor M5 in the string 104 will be changed into an enhancement mode transistor, that is, the transistor M5 of the string 104 will be programmed. It is assumed in general that a programmed memory cell transistor stores logic "1" data.

In the above-described programming, it is necessary that the unselected cell transistor adjacent to a selected cell transistor and placed between the selected cell transistor and the string select transistor Mss should remain erased in order to induce F-N tunneling. For this reason, the programing should always be performed sequentially, from the cell transistor M1 adjacent to the ground select transistor Mgs toward the cell transistor Mi adjacent to the sting select transistor Mss.

SUMMARY OF THE INVENTION

It is therefore an object of the present invention to provide a method for programming a non-volatile NAND structured EEPROM device, which capable of programming the memory device without restriction of programming sequence.

The foregoing object and other objects are achieved as is now described.

An electrically erasable and programmable non-volatile semiconductor device includes a string of a plurality of memory cell transistors and a plurality of word lines. Each cell transistor has a source, a drain, a channel, a floating gate and a control gate. Control gates of the cell transistors are connected to the word lines. Source-drain channels of the cell transistors are connected in series between a string selection circuit for selecting the cell string and a reference selection circuit for providing a reference potential to the cell string.

A method for programming the above-described memory device comprises selecting the cell string by means of the string selection circuit, selecting one of the word lines, applying a pass voltage to unselected word lines, applying a voltage lower than the pass voltage to the word line which is adjacent to the selected word line and is placed between the selected word line and the reference selection circuit, and applying a program voltage to the selected word line. In an embodiment, the voltage lower than the pass voltage equals ground potential.

As is apparent from the foregoing, according to the programming method of the invention, it is unnecessary that the unselected cell transistor, adjacent to a selected cell transistor and placed between the selected cell transistor and the string select transistor, should remain erased. As a result of this, the NAND cell array can be programmed independent of the programming sequence.

The above as well as additional objects, features, and advantages of the present invention will become apparent in the following detailed written description.

BRIEF DESCRIPTION OF THE DRAWINGS

The above object and other advantages of the present invention will become more apparent by describing in detail a preferred embodiment of the present invention with reference to the attached drawing in which.

DETAILED DESCRIPTION OF THE PREFERRED EMBODIMENTS

Preferred embodiment of the present invention will now be described with reference to the accompanying drawings.

Figure 1:
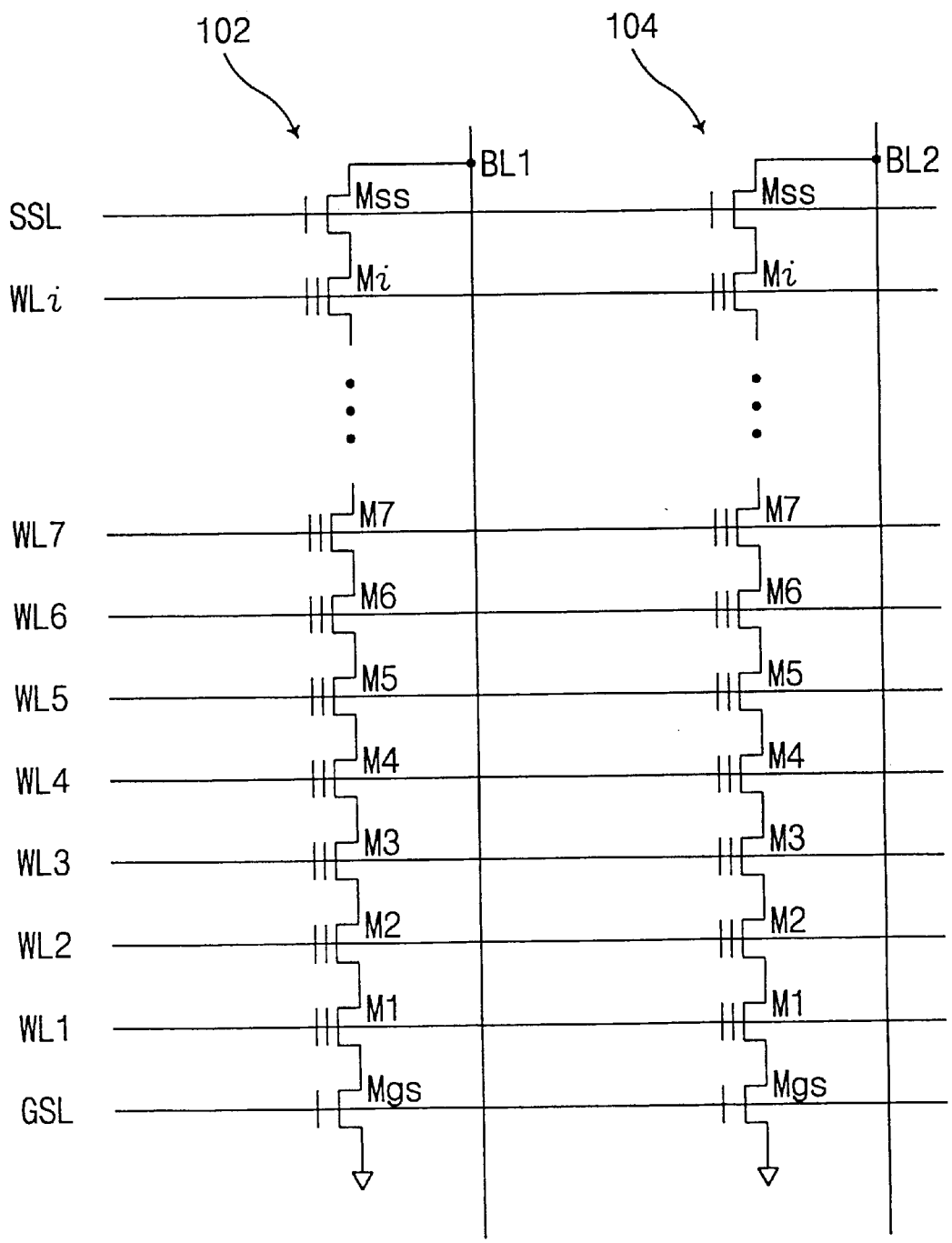
FIG. 1 is an equivalent circuit diagram of typical NAND cell strings of an EEPROM device.
Figure 2:
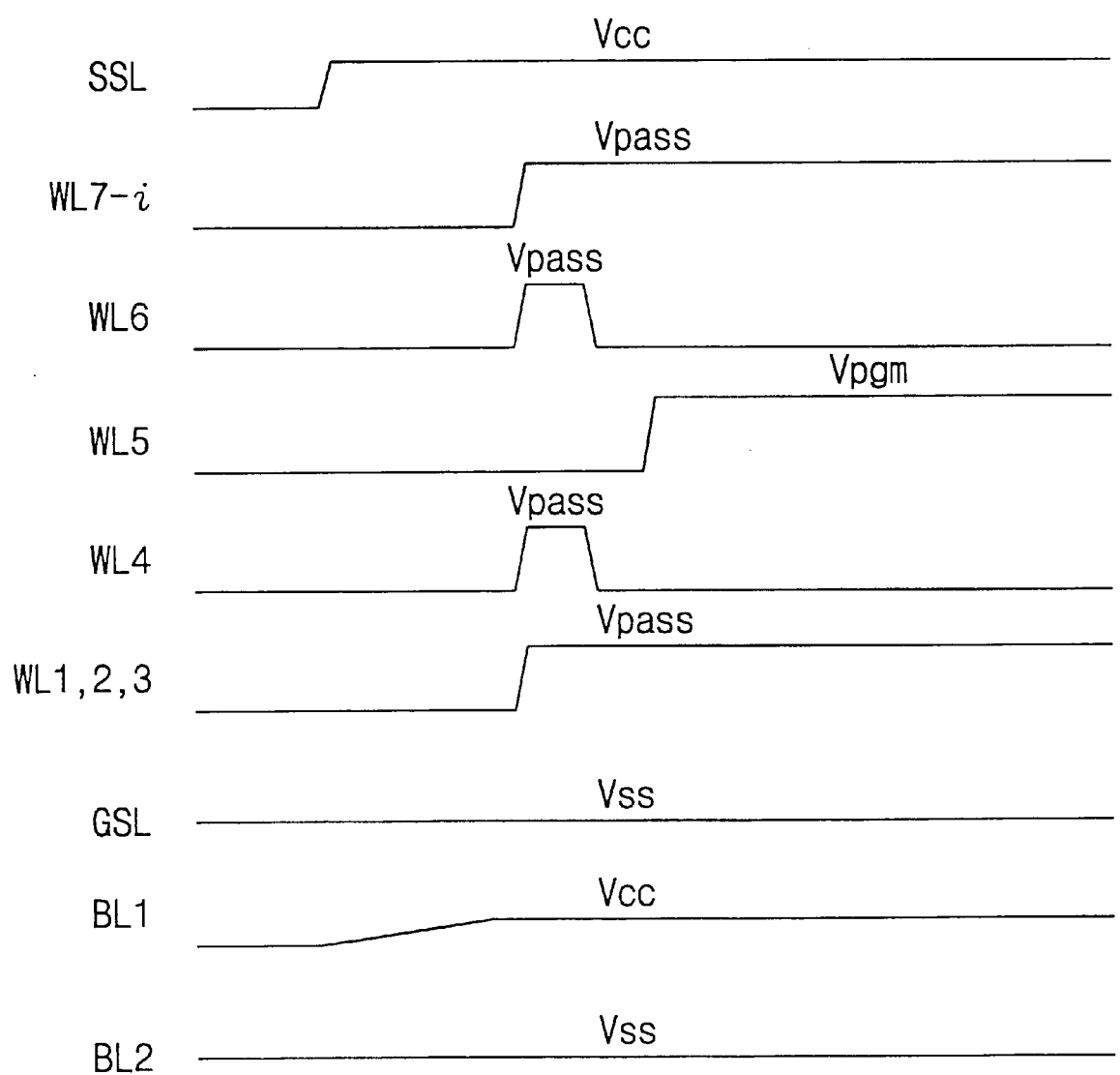
FIG. 2 is a timing diagram illustrating a conventional program operation of the device of FIG. 1.

FIG. 1 is an equivalent circuit diagram of two EEPROM NAND cell strings 102 and 104 connected to bit lines BL1 and BL2, respectively, to which this invention is applicable. As shown, respective NAND cell strings 102 and 104 include a string selection circuit having select transistors Mss, a reference selection circuit having select transistors Mgs, and memory cell transistors M1 through Mi. In each cell string 102 or 104, drain-source paths of memory cell transistors M1 to Mi are connected in series between the string selection circuit and reference selection circuit, i.e., between a source of a corresponding string select transistor Mss and a drain of a corresponding ground select transistor Mgs. The string selection circuit selects cell strings 102 and 104, and a reference selection circuit provides a reference potential, such as ground potential $V_{SS}$, to cell strings 102 and 104.

Each of the memory cell transistors M1 through Mi has its drain and source spaced apart by its channel. Further, its floating gate is formed on a tunnel oxide film over the channel and its control gate is formed on an intermediate dielectric film over the floating gate. A drain of the string select transistor Mss is connected to the bit line BL1 or BL2 and a source of the ground select transistor Mgs is connected to a common source line (not shown) which is grounded during either programming or read operation. Gates of string select transistor Mss and ground select transistor Mgs are coupled with a string selection line SSL and a ground selection line GSL, respectively. Gates of memory cell transistors M1 through Mi are connected to word lines WL1 through WLi, respectively.

Figure 3:
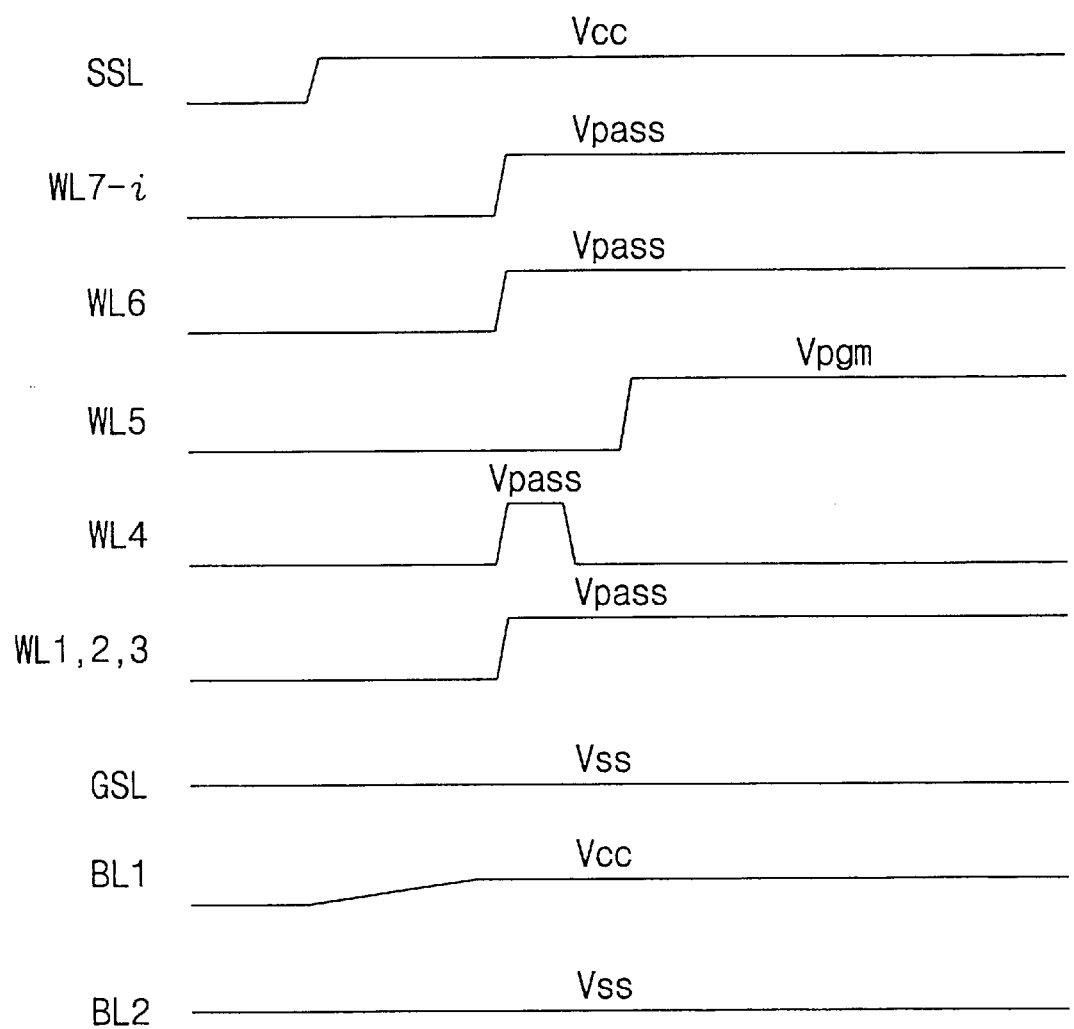
FIG. 3 is a timing diagram illustrating a program operation of an EEPROM device having a NAND structured cell array, in accordance with the present invention.

FIG. 3 is a timing diagram illustrating a program operation of NAND structured EEPROM devices according to the present invention. From now, a programming method of the invention will be described with reference to FIG. 3.

Before programming the memory transistors of a NAND structured EEPROM, an erase operation is normally performed. In this operation, the erasure of memory cell transistors M1 through Mi will be accomplished by applying an erase potential, such as 20 volts, to a semiconductor substrate and applying a reference potential, such as 0 volts (i.e., ground voltage $V_{SS}$), to word lines WL1 to WLi. Charge carriers (i.e., electrons) stored by the floating gates of memory cell transistors M1 to Mi will be extracted by F-N tunneling, and thereby the memory cell transistors M1 to Mi will be changed into depletion mode transistors.

After such an erase operation, a program or write operation is performed as illustrated in FIG. 3. For example, it is assumed herein that memory cell transistor M5 is to be programmed. In this operation, first, a power supply voltage $V_{CC}$ and a ground voltage $V_{SS}$ is applied to the string selection line SSL and ground selection line GSL, respectively. Further, each of the bit lines BL1 and BL2 is supplied with either the ground voltage $V_{SS}$ (data "0") or the power supply voltage $V_{CC}$ (data "1") in accordance with the data state to be programmed. It is assumed that the bit lines BL1 and BL2 are supplied with power supply voltage $V_{CC}$ (data "1") and the ground voltage $V_{SS}$ (data "0"), respectively. Subsequently, all of the word lines WL1–WL4 and WL6–WLi (i.e., unselected word lines) but a selected word line WL5 are provided with a pass voltage $V_{pass}$, such as 8 volts, and the semiconductor substrate with a reference potential, such as ground voltage $V_{SS}$. After an elapse of a given time, only the word line WL4, which is adjacent to the selected word line WL5 and placed between the selected word line WL5 and the ground selection line GSL, is applied with a voltage lower than the pass voltage $V_{pass}$, for example, ground voltage $V_{SS}$. Thus, the unselected cell transistor M6, adjacent to the selected transistor M5 and placed between the selected transistor M5 and the string select transistor Mss, is maintained conductive regardless of its programmed state in this operation. This means that it is unnecessary that the unselected cell transistor adjacent to a selected cell transistor and placed between the selected cell transistor and the string select transistor Mss should remain erased. As a result, it is possible to program the NAND cell array in random sequence. Thereafter, a program voltage $V_{pgm}$, such as 18 volts, is applied to the selected word line WL5.

In such a program operation, the string select transistor Mss in the string 102 coupled with bit line BL1 of the power supply voltage $V_{CC}$ is turned off so that the cell string 102 is floated. Thus, the source, drain and channel potentials of the selected cell transistor M5 in the string 102 is boosted up due to the capacitive coupling when the program voltage $V_{pgm}$ is applied to the control gate of the transistor M5 in the string 102. Namely, the potential difference between the control gate and the source is too small to permit F-N tunneling to occur. So, the selected cell transistor M5 in the string 102 remains erased.

But, since the string select transistor Mss in the string 104 coupled to bit line BL2 of the ground voltage $V_{SS}$ is turned on, the source, drain and channel potentials of the selected cell transistor M5 in the string 104 equals the ground voltage $V_{ss}$, thereby electrons are accumulated into the floating gate of the transistor M5 in the string 104 by F-N tunneling when the program voltage $V_{pgm}$ is applied to the control gate of the transistor M5 in the string 104. Consequently, the selected cell transistor M5 in the string 104 is changed into an enhancement mode transistor, that is, the transistor M5 of the string 104 is programmed.

As described above, according to the present invention, it is unnecessary that the unselected cell transistor adjacent to a selected cell transistor and placed between the selected cell transistor and the string select transistor Mss should remain erased. So, the program operation for the NAND cell array can be performed without considering the programming sequence.

In the drawings and specification, there has been disclosed a typical preferred embodiment of the invention and, although specific terms are employed, they are used in a generic and descriptive sense only and not for purposes of limitation, the scope of the invention being set fourth in the following claims.

What is claimed is:

1. A method for programming an electrically erasable and programmable non-volatile semiconductor device having a string of a plurality of memory cell transistors and a plurality of word lines; each cell transistor including a source, a drain, a channel, a floating gate and a control gate; control gates of said cell transistors being connected to said word lines; source-drain channels of said cell transistors being connected in series between a string selection circuit for selecting said string and a reference selection circuit for providing a reference potential; said method comprising steps of:

selecting said string by means of said string selection circuit;

selecting one of said word lines;

applying a pass voltage to unselected word lines;

applying a voltage lower than said pass voltage to the word line which is adjacent to said selected word line and is placed between said selected word line and said reference selection circuit; and applying a program voltage to said selected word line.

2. The method of claim 1, wherein said voltage lower than said pass voltage equals ground potential.

* * * * *